(12) United States Patent
Bhattad et al.

(10) Patent No.: US 9,372,491 B2
(45) Date of Patent: Jun. 21, 2016

(54) MAINTAINING THE RESISTOR DIVIDER RATIO DURING START-UP

(71) Applicants: Dialog Semiconductor GmbH, Kirchheim/Teck-Nabern (DE); Dialog Semiconductor B.V.

(72) Inventors: Ambreesh Bhattad, Swindon (GB); Ludmil Nikolov, Chippenham (GB); Marinus Wilhelmus Kruiskamp, 's-Hertogenbosch (NL)

(73) Assignees: Dialog Semiconductor GmbH, Kirchheim/Teck-Nabern (DE); Dialog Semiconductor B. V., 's-Hertogenbosch (NL)

( * ) Notice: Subject to any disclaimer, the term of this patent is extended or adjusted under 35 U.S.C. 154(b) by 0 days.

(21) Appl. No.: 14/794,135

(22) Filed: Jul. 8, 2015

(65) Prior Publication Data

US 2015/0309520 A1 Oct. 29, 2015

Related U.S. Application Data

(62) Division of application No. 13/756,568, filed on Feb. 1, 2013.

(30) Foreign Application Priority Data

Jan. 25, 2013 (EP) .................................. 13392001

(51) Int. Cl.
G05F 1/575 (2006.01)
G05F 3/02 (2006.01)
H03G 1/00 (2006.01)
H03F 3/04 (2006.01)

(52) U.S. Cl.
CPC *G05F 1/575* (2013.01); *G05F 3/02* (2013.01); *H03F 3/04* (2013.01); *H03G 1/0094* (2013.01)

(58) Field of Classification Search
CPC ......... G05F 3/02; G05F 1/575; H03G 1/0094; H01G 1/0094; H03F 3/04
USPC ......... 323/269–277, 279–281, 901, 222, 223, 323/226, 233
See application file for complete search history.

(56) References Cited

U.S. PATENT DOCUMENTS 6,208,124 B1 3/2001 Fuchigami et al.
7,122,996 B1 10/2006 Huang (Continued)

FOREIGN PATENT DOCUMENTS

WO WO 2011/090687 7/2011

*Primary Examiner* — Timothy J Dole
*Assistant Examiner* — Ivan Laboy Andino
(74) *Attorney, Agent, or Firm* — Saile Ackerman LLC; Stephen B. Ackerman

(57) ABSTRACT

Circuits and methods to maintain a resistive voltage divider ratio during start-up of an electronic circuit comprising a feed-forward capacitor across a feedback resistor using a dynamic start-up circuit are disclosed as e.g. a LDO or an amplifier. In a preferred embodiment of the disclosure is applied to an LDO. Modification of the resistive voltage divider ratio caused by the feed-forward capacitor during start-up is prevented while the voltage level of a voltage access point of the voltage divider on the feed-forward capacitor is maintained. A start-up circuit comprises a start-up capacitor and a start-up comparator.

13 Claims, 5 Drawing Sheets

(56) References Cited

U.S. PATENT DOCUMENTS

| | | |
|---|---|---|
| 7,453,249 B2 | 11/2008 | Lenz et al. |
| 7,531,996 B2 | 5/2009 | Yang et al. |
| 7,872,454 B2 | 1/2011 | Sutardja |
| 2011/0254521 A1* | 10/2011 | Iacob ................. G05F 1/575 323/282 |
| 2011/0291636 A1 | 12/2011 | Sudou |
| 2013/0169251 A1* | 7/2013 | Wan ................. G11C 5/147 323/282 |

* cited by examiner

MAINTAINING THE RESISTOR DIVIDER RATIO DURING START-UP

This is a divisional application of U.S. patent application Ser. No. 13/756,568 filed on Feb. 1, 2013, which is herein incorporated by reference in its entirety, and assigned to a common assignee.

BACKGROUND (1) Technical Field

The present document relates to start-up processes of electronic circuits. In particular, the present document relates to a method and system for maintaining a resistor voltage divider ratio during start-up using a dynamic circuit.

(2) Background

Prior art implementations of circuits as e.g. a low-dropout (LDO) voltage regulator using a feed-forward capacitor in parallel to a feedback resistor of a resistor voltage divider have the disadvantage that a voltage divider ratio is impacted by the feed-forward capacitor during start-up phase and clean start-up specification may not always being met.

It is a challenge for engineers to design start-up processes of circuits as e.g. an LDO without the disadvantage cited above.

SUMMARY

A principal object of the present disclosure is to achieve a correct determination of the output voltage of a circuit by a start-up comparator.

A further object of the disclosure is to avoid an output voltage drop (brown out) condition of the circuit as e.g. an LDO.

A further object of the disclosure is to avoid any violation of a start-up specification.

A further object of the disclosure is to achieve a clean start-up process.

A further object of the disclosure is to maintain a constant voltage divider ratio during start-up.

A further object of the disclosure is to use a dynamic circuit to manage the start-up process only during start-up.

In accordance with the objects of this disclosure a method to maintain a resistive voltage divider ratio during start-up of any electronic circuit comprising a feed-forward capacitor across a feedback resistor of a resistive voltage divider using a dynamic start-up circuit has been disclosed. The method disclosed comprises the following steps: (1) providing an electronic circuit comprising a feed-forward capacitor across a first feedback resistor of a resistive voltage divider and a start-up circuit, (2) avoiding modification of resistive voltage divider ratio caused by feed-forward capacitor during start-up phase, (3) monitoring output voltage and finish start-up-phase when desired output voltage of the electronic circuit is reached, and (4) processing normal operation after start-up phase is finished wherein feed-forward capacitor is connected across the feedback resistor of the resistive voltage divider after end of start-up phase.

In accordance with the objects of this disclosure a circuit to maintain a resistive voltage divider ratio during start-up of a LDO comprising a feed-forward capacitor across a feedback resistor using a dynamic start-up circuit has been achieved. The circuit disclosed comprises, the feed-forward capacitor, wherein a first plate of the feed-forward capacitor is connected to an output port of the LDO voltage, said resistive voltage divider, being connected between the output port of the LDO and ground, comprising the feedback resistor having a resistance R2 connected between the output port of the LDO and the voltage access point in-between the voltage divider having a fraction of the output voltage and further comprising a second resistor having a resistance R1, and a means to maintain a voltage level of the voltage access point across the feed-forward capacitor during start-up of the LDO.

In accordance with the objects of this disclosure a circuit to maintain a resistive voltage divider ratio during start-up of any electronic circuit comprising a feed-forward capacitor across a feedback resistor and a resistive voltage divider using a dynamic start-up circuit, has been disclosed. The circuit disclosed firstly comprises: the feed-forward capacitor, wherein a first plate of the feed-forward capacitor is connected to an output port of the circuit and a second plate is connected to a voltage access point of the resistive voltage divider after the start-up phase of the electronic circuit is finished and said resistive voltage divider, being connected between an output port of the circuit and ground, comprising the feedback resistor having a resistance R2 connected between the output port of the circuit and the voltage access point in-between the voltage divider having a fraction of the output voltage and further comprising a second resistor having a resistance R1. Furthermore the circuit comprises: a start-up comparator detecting if the start-up phase is finished by comparing a voltage representing the output voltage of the electronic circuit with a reference voltage and a means to maintain a voltage level of the voltage access point across the feed-forward capacitor during start-up of the circuit, wherein the means to maintain a voltage level of the voltage access point comprises switching means to connect or disconnect components of the circuit at beginning and end of the start-up process, wherein the switching means are activated by the start-up comparator.

BRIEF DESCRIPTION OF THE DRAWINGS

In the accompanying drawings forming a material part of this description, there is shown.

DESCRIPTION OF THE PREFERRED EMBODIMENTS

Methods and circuits to achieve fast and clean start-up process of an electronic circuit as e.g. a LDO or an amplifier using a feed-forward capacitor and a resistive voltage divider or another means to represent an output voltage of the electronic circuit are disclosed. It has to be noted that the methods and circuits disclosed can be applied to any other circuits using a feed-forward capacitor and a resistive voltage divider.

Figure 4:
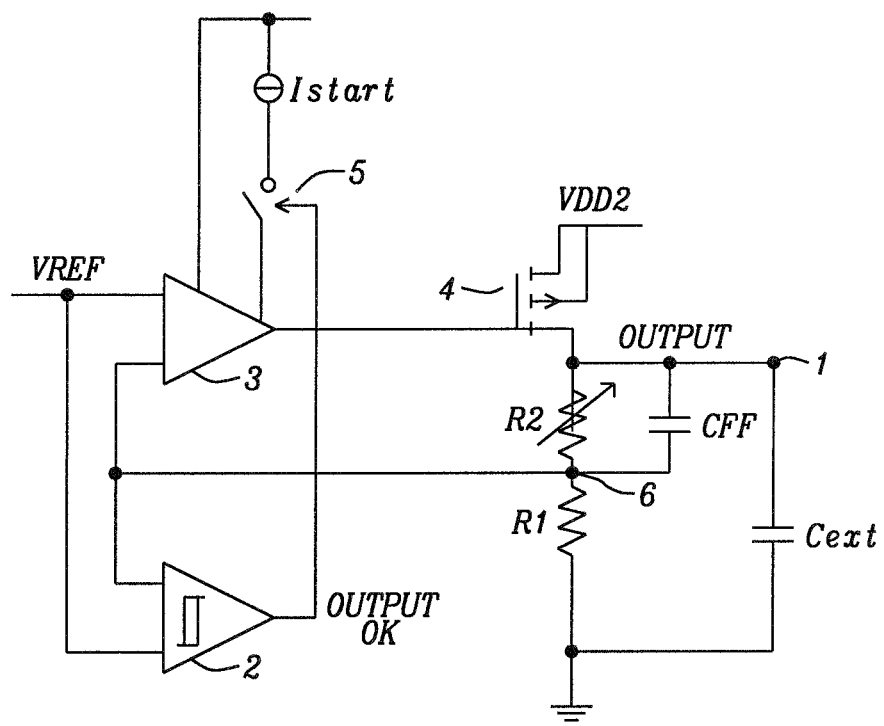
FIG. 4 shows basic elements of an embodiment of a start-up circuit of the present disclosure applied for example to a LDO.

FIG. 4 shows basic elements of an embodiment of a start-up circuit of the present disclosure applied for example to a LDO. The circuit comprises a port for output voltage 1, a resistor voltage divider comprising a first resistor R1 and a second controllable resistor R2, a start-up comparator 2, a differential amplifier 3, having as inputs a reference input voltage $V_{ref}$ and the voltage of a voltage access point divider-in 6 of the voltage divider R1/R2, representing the output voltage $V_{out}$ of the circuit as input, and a pass transistor 4. During the start-up phase a current source $I_{START}$ provides an extra bias current to the differential amplifier 3. A switch 5 opens and hence deactivates the extra bias current $I_{START}$ when the start-up phase is finished.

The output of the start-up comparator 2 indicates that the circuit as e.g. a LDO is now ready for loading, i.e. the output of the comparator 2 triggers interrupting the extra bias current via switch 5. The feed-forward capacitor CFF modifies the resistor divider R1/R2 ratio The circuit of FIG. 4 may have the following disadvantages:
1. Longer startup time
2. Startup specifications may not being met
3. Incorrect decision by startup comparator about the output voltage which may impact system functionality if this output is used to load the output of the circuit
4. Drop in voltage of the LDO (brown out).

Figure 1:
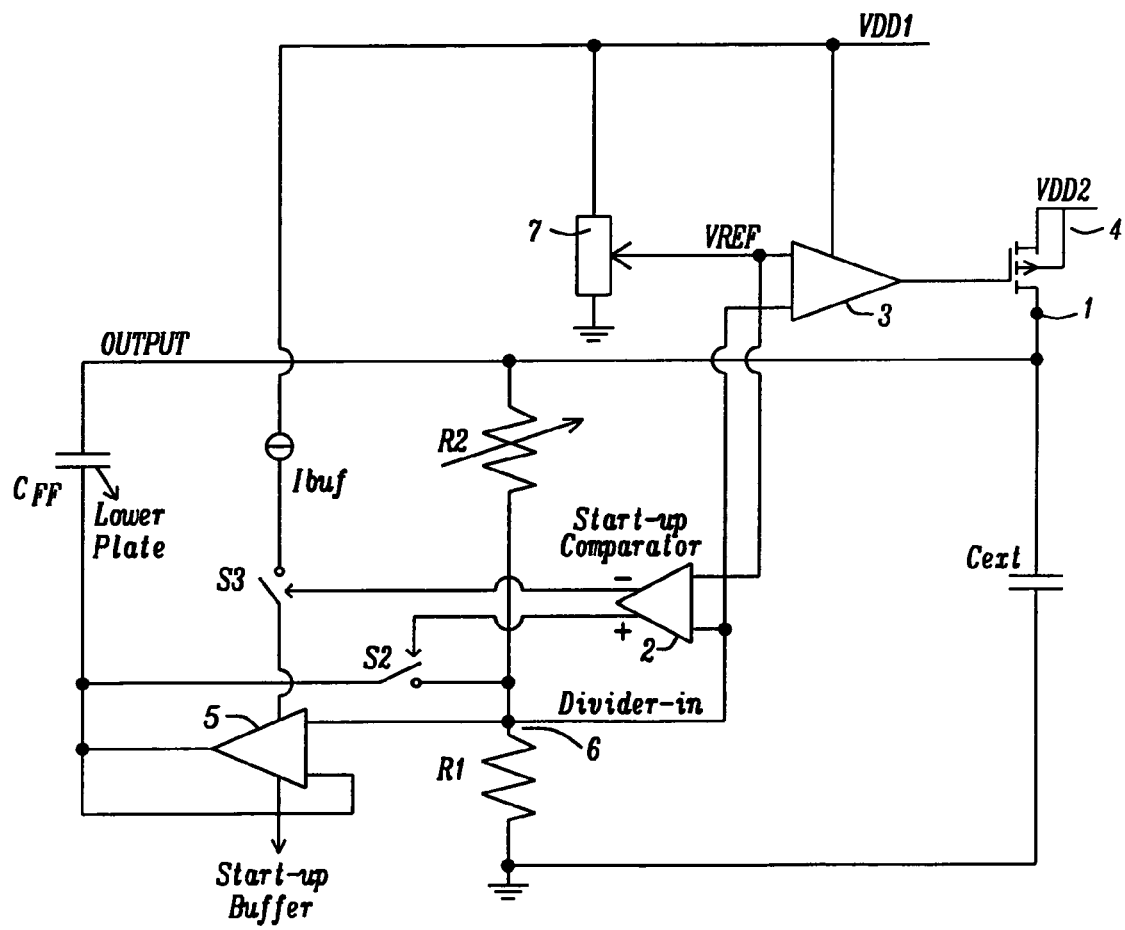
FIG. 1 shows the basic elements of a second embodiment of a start-up circuit of the present disclosure applied to a LDO.

FIG. 1 shows a second embodiment of a start-up circuit of the present disclosure overcoming the disadvantages cited above. The start-up circuit of FIG. 1 can also be applied for example to a LDO or to other circuits as amplifiers, etc. . . . .

The circuit disclosed comprises a port for output voltage 1, a resistor voltage divider comprising in a preferred embodiment a first resistor R1 and a second controllable resistor R2, a start-up comparator 2, a differential amplifier 3, having a reference input voltage $V_{ref}$ and the voltage of a voltage access point divider-in 6 of the voltage divider R1/R2, representing the output voltage $V_{out}$ of the circuit as input, a start-up buffer 5, and a pass transistor 4.

Furthermore FIG. 1 shows a means to generate a fixed or a variable reference voltage 7. The reference voltage is an input to a differential amplifier 3.

Each of the resistors R1 and R2 could be implemented by more than one resistor in series. Furthermore other resistive means than resistors could be implemented for the voltage divider as well, e.g. transistors (BJT or MOS) or diodes or FETS or MOS transistors connected as diodes.

The output of the start-up comparator 2, comparing voltage $V_{ref}$ with the voltage of the voltage access point divider-in 6 of the voltage divider R1/R2, indicates that the circuit, as e.g. a LDO, that a start-up phase is completed and is now ready for loading. The comparator 2 controls the duration of a biasing current $I_{buf}$ for the start-up buffer 5 via switch S3. Switch S3 opens after start-up is completed, i.e. comparator 2 detects that voltage $V_{ref}$ is equal to divider-in 6 voltage, switch S3 opens, biasing current $I_{buf}$ is interrupted and start-up time specification are met.

Furthermore the circuit comprises a capacitor $C_{ext}$, at the output which may be deployed externally or internally to the circuit, and a feed-forward capacitor $C_{FF}$, which is connected only after start-up phase is completed in parallel to the controllable resistor R2. Capacitor $C_{FF}$ is connected in parallel to the controllable resistor R2 via switch S2, which is closed after the start-up phase is completed. The comparator 2 detects when the start-up phase is completed and activates the closing of switch S2.

Furthermore there may be an optional current source $I_{start}$ providing an optional bias current to the differential amplifier 3 during start-up, wherein the optional current source $I_{start}$ may be activated by a switch S1, which is used only if the optional extra bias current is to be provided during the startup. Switch S1 is also optional, it is not required if no extra bias current to the amplifier 3 is required during start-up of the circuit. Switch S2 connects, after it is closed when the start-up phase is finished, a voltage access point of the voltage divider R1/R2 to a lower plate of the feed-forward capacitor $C_{FF}$.

Furthermore it should be noted that voltages VDD1 and VDD2 can be the same or different.

During startup the switch S3 is closed and switch S2 is open. The open switch S2 disconnects the feed-forward capacitor $C_{FF}$ from the resistor divider R1/R2 but the start-up buffer 5 maintains the lower plate of feed-forward capacitor $C_{FF}$ to a same potential as the voltage access point divider_in 6 of the voltage divider R1/R2. Once the output voltage Vout reaches the desired voltage, switch S2 is closed and switch S3 is opened. The start-up buffer is then shut down.

The start-up buffer 5 is a means to maintain the voltage level of the voltage access point divider_in 6 of the resistive voltage divider R1/R2 on the feed-forward capacitor without impacting the voltage divider ratio. Other means could be used for this purpose as well. It has to be noted that the startup buffer 5 consumes power only during the start-up phase of the circuit. It does not add to the quiescent current consumption of the circuit.

Figure 2:
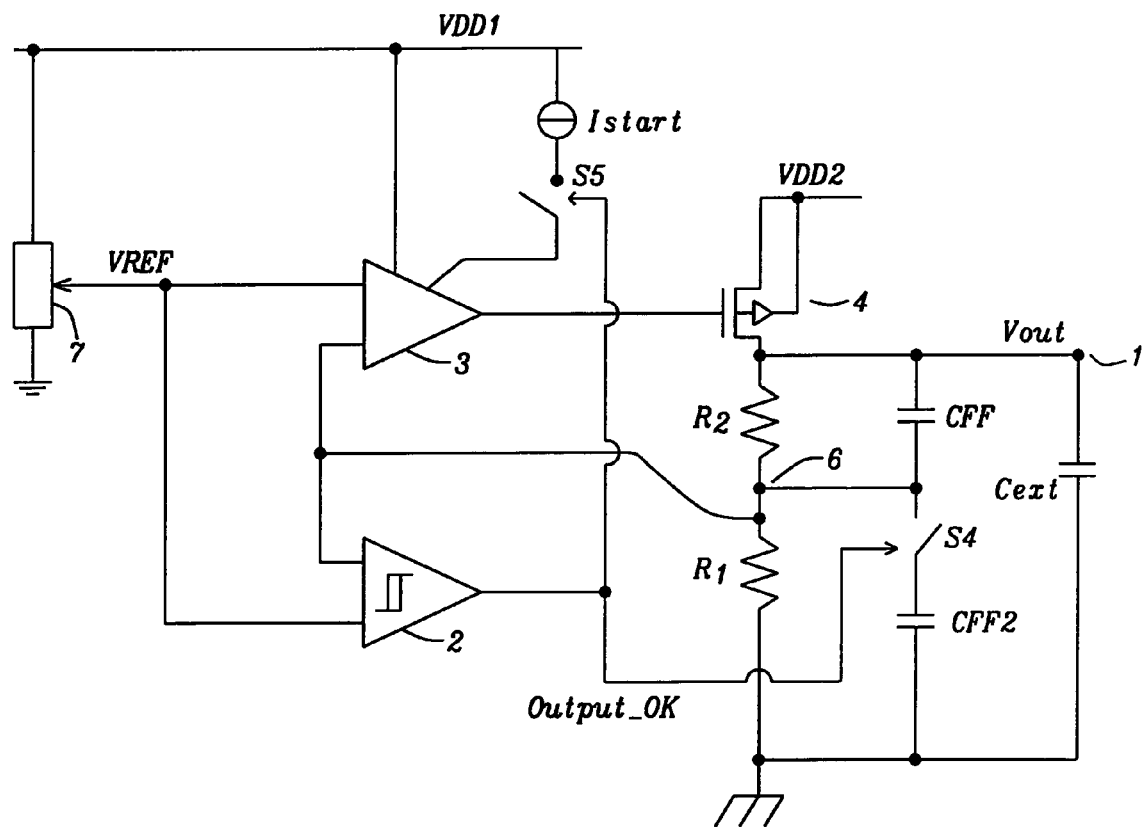
FIG. 2 illustrates a third embodiment of a start-up circuit of the present disclosure applied to a LDO.

FIG. 2 illustrates a third embodiment of a start-up circuit of the present disclosure applied to a LDO. Similarly to the circuit shown in FIG. 1 the circuit of FIG. 2 comprises also a differential amplifier 3, a start-up comparator 2, a pass transistor 4, and a voltage divider R1/R2 with a the voltage access point divider_in 6. The differential amplifier 3 may have a fixed or variable reference voltage as first input and the voltage of the voltage access point divider_in 6 as second input. As shown in FIG. 1 the start-up comparator 2 detects when the start-up phase is completed. The resistors R1/R2 may have a fixed resistance, or both a controllable resistance, or a combination thereof.

This implementation is characterized by having a start-up capacitor $C_{FF2}$ connected during the start-up phase in series with the feed-forward capacitor $C_{FF}$ and in parallel to resistor R1, i.e. the resistive voltage divider R1/R2 and the capacitor string $C_{FF}/C_{FF2}$ are in parallel, while a mid-point of the capacitor string is connected to the voltage access point divider_in 6 of the resistive divider R1/R2.

A key point of the circuit of FIG. 2 is that the start-up capacitor $C_{FF2}$ is disconnected by switch S4 at the end of the start-up phase, which is triggered by the start-up comparator 2.

The start-up capacitor $C_{EFF2}$ has a capacitance of $C_{FF} \times R2/R1$, i.e. the capacitive string has capacitances according to the resistances of the resistive voltage divider R1/R2. Thus $C_{FF2}$ prevents any modification of the resistive voltage divider ratio by the feed-forward capacitor $C_{FF}$ during start-up.

Similarly to the circuit shown in FIG. 1 a start-up comparator 2 monitors if the output voltage has reached a desired level and if the start-up phase is finished and the desired output level has been reached the start-up comparator activates that switch S4 is opened and hence the additional capacitor $C_{EFF2}$ is disconnected.

Furthermore there may be an optional current source $I_{start}$ providing an optional extra bias current to the differential amplifier 3 during start-up, wherein the optional current source $I_{start}$ may be activated by a switch S5, which is used only if the optional extra bias current is to be provided during the startup to the differential amplifier 3. Switch S5 is also optional, it is not required if no extra bias current to the amplifier 3 is required during start-up of the circuit.

The embodiment of FIG. 2 does not require, compared to the circuit of FIG. 1, a start-up buffer amplifier 5 and switches S2 and S3 as shown in FIG. 1, but it requires switch S4 and the additional capacitor $C_{FF2}$, which will be disconnected by switch S4 after start-up is completed. Furthermore, FIG. 2 shows a means to generate a fixed or a variable reference voltage 7, e.g. a potentiometer. The reference voltage is an input to a differential amplifier 3.

Similarly to the circuit of FIG. 1 the circuit of FIG. 2 may comprise a capacitor $C_{ext}$ at the output which may be deployed externally or internally to the circuit.

In alternative embodiments of the circuits of FIG. 1 or FIG. 2 the reference input voltage $V_{ref}$, as shown in FIG. 1 and FIG. 2, may be replaced by a variable voltage Vin or both resistors R1 and R2 are controllable. Alternatively it would be possible to have a fixed resistance for R2 and a controllable resistance for R1.

Figure 5:
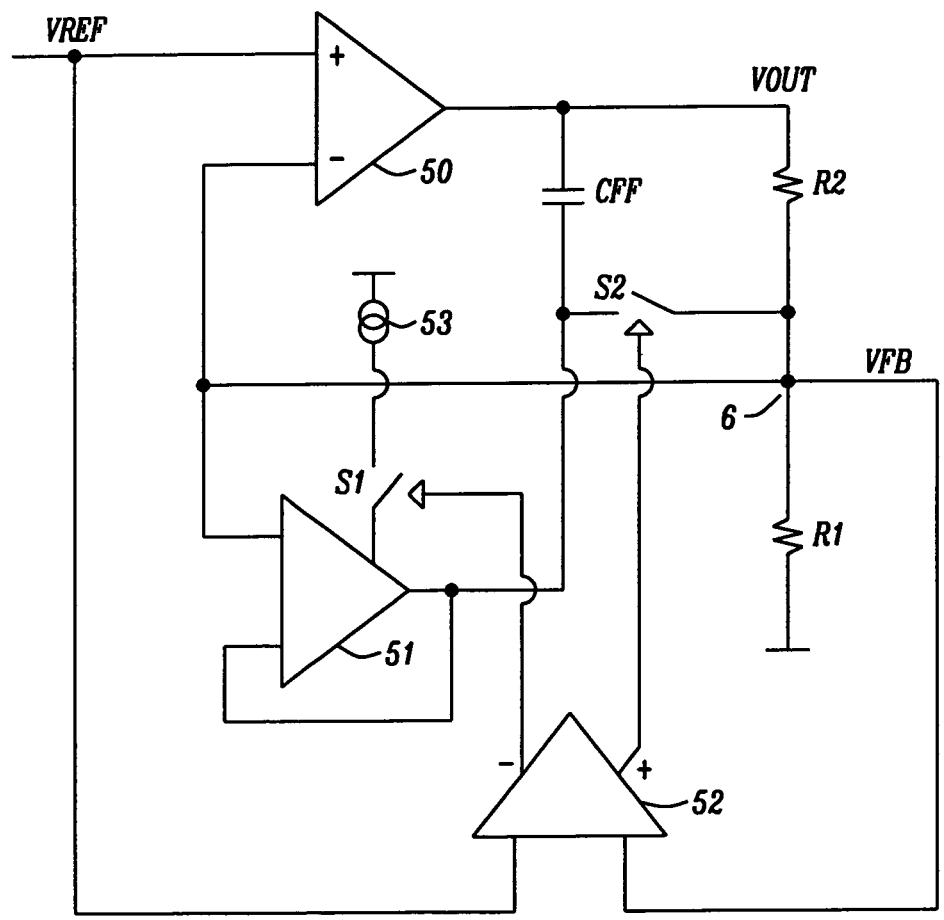
FIG. 5 shows an embodiment of the invention applied to an amplifier.

FIG. 5 illustrates an embodiment of the disclosure applied to an amplifier. This embodiment comprises all innovative features of the embodiment of shown in FIG. 1 applied to an LDO. The non-inverting amplifier comprises a differential amplifying unit 50, a startup buffer 51, and a start-up comparator 52. Furthermore the amplifier comprises resistive divider R1/R2, deployed between the output voltage Vout and ground having an voltage access point between resistors R1 and R2 providing feedback to the amplifying unit 50. Especially important is the feed forward capacitor $C_{FF}$, wherein a first terminal of the feed forward capacitor $C_{FF}$ is connected to the output voltage Vout and a second terminal of the feed forward capacitor $C_{FF}$ is connected to the output of the startup buffer 51. Similar to the implementation shown in FIG. 1 the switch S2 connects the voltage access point of the resistive voltage divider R1/R2 with the second terminal of the capacitor $C_{FF}$ and the switch 2 is controlled the same way as in the deployment shown in FIG. 1 by the startup comparator 52. The startup comparator controls also switch S1 connecting the startup buffer 51 during the startup phase with the biasing current source 53. When the startup phase is finished switch S1 is opened and no more power is consumed by the startup buffer 51.

Figure 3:
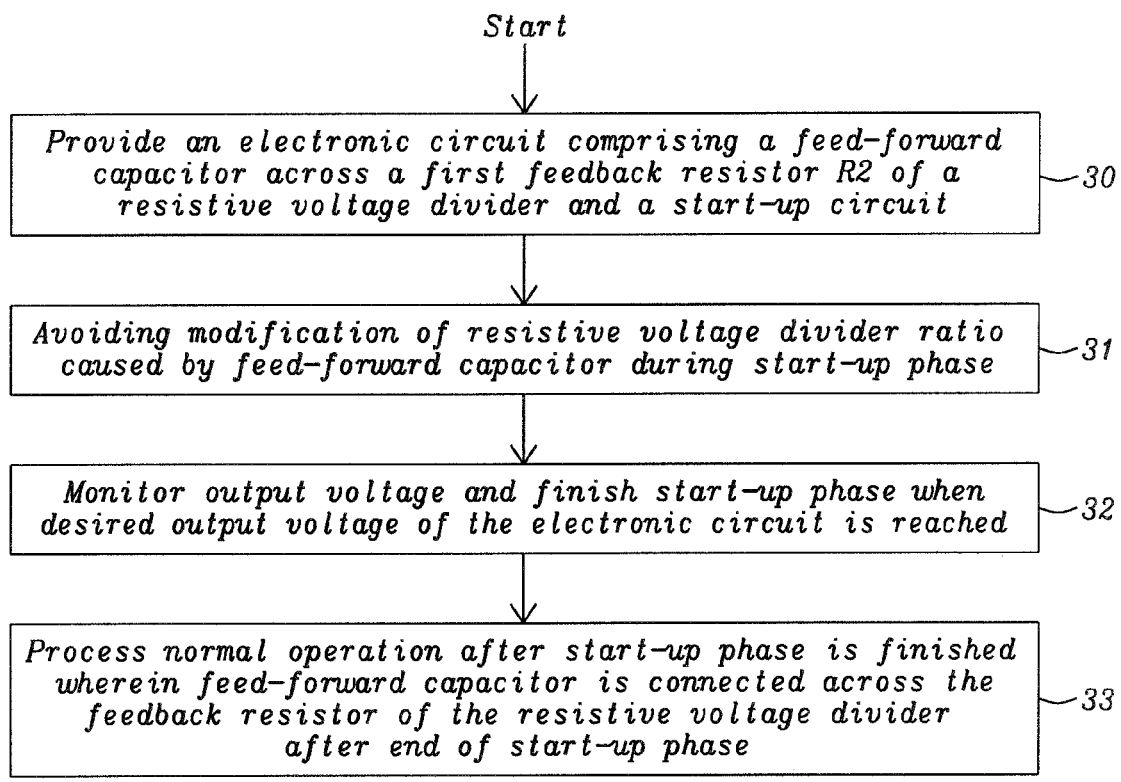
FIG. 3 illustrates a flowchart of a method to maintain a resistive voltage divider ratio during start-up of an electronic circuit comprising a feed-forward capacitor across a feedback resistor using a dynamic start-up circuit.

FIG. 3 illustrates a flowchart of a method to maintain a resistive voltage divider ratio during start-up of an electronic circuit such as a LDO, amplifier, or buffer comprising a feed-forward capacitor across a feedback resistor using a dynamic start-up circuit. As already mentioned above, the circuit and the method disclosed are applicable to any circuit using a resistive voltage divider and a feed-forward capacitor. Step 30 of the method of FIG. 3 illustrates the provision of e.g. a LDO or any other suitable circuit as e.g. an amplifier comprising a feed-forward capacitor across a first feedback resistor R2 of a resistive voltage divider and a start-up circuit. Step 31 depicts avoiding modification of resistive voltage divider ratio caused by feed-forward capacitor during start-up phase. Step 32 illustrates monitoring output voltage and finish start-up-phase when desired output voltage of the electronic circuit is reached. Step 33 shows processing normal operation after start-up phase is finished wherein feed-forward capacitor is connected across the feedback resistor of the resistive voltage after end of start-up phase.

While the disclosure has been particularly shown and described with reference to the preferred embodiments thereof, it will be understood by those skilled in the art that various changes in form and details may be made without departing from the spirit and scope of the disclosure.

What is claimed is:

1. A method to maintain a resistive voltage divider ratio during start-up of any electronic circuit comprising a feed-forward capacitor across a second feedback resistor of a resistive voltage divider using a dynamic start-up circuit, comprising the following steps:

(1) providing the electronic circuit comprising the feed-forward capacitor across the second feedback resistor of the resistive voltage divider, a differential amplifier, and the dynamic start-up circuit comprising a start-up comparator and a start-up capacitor across a first feedback resistor of the resistive voltage divider and switching means;

(2) avoiding modification of the resistive voltage divider ratio caused by the feed-forward capacitor during start-up phase by the dynamic start-up circuit, wherein the start-up capacitor is connected to a voltage mid-point of the resistive voltage divider during start-up phase only;

(3) monitoring an output voltage of the electronic circuit and finish start-up-phase when a desired output voltage of the electronic circuit is reached, wherein the start-up comparator detects if the desired output voltage of the electronic circuit is reached by comparing a voltage representing the output voltage of the electronic circuit with a reference voltage and once both voltages are the same the start-up phase is finished; and (4) processing normal operation after start-up phase is finished wherein the start-up comparator disconnects via the switching means the start-up capacitor from the voltage mid-point of the resistive voltage divider when the start-up phase is finished.

2. The method of claim 1 wherein said electronic circuit is an LDO.

3. The method of claim 1 wherein said electronic circuit is an amplifier.

4. The method of claim 1 wherein the reference voltage is a variable voltage.

5. The method of claim 1 wherein the start-up capacitor has a capacitance of $C_{FF} \times R2/R1$, wherein $C_{FF}$ is a capacitance of the feed-forward capacitor, R1 is a resistance of the first feedback resistor of the voltage divider and R2 is a resistance of the second feedback resistor of the voltage divider.

6. A circuit to maintain a resistive voltage divider ratio during start-up of any electronic circuit comprising a feed-forward capacitor across a second feedback resistor of a resistive voltage divider using a dynamic start-up circuit, comprising:

a pass transistor connected between a VDD voltage and an output port of the circuit, wherein a gate of the pass transistor is connected to an output of an output port of a differential amplifier;

said differential amplifier having two inputs wherein the first input is a reference voltage and the second input is a voltage representing the output voltage of the circuit;

said feed-forward capacitor, wherein a first plate of the feed-forward capacitor is connected to the output port of the circuit and a second plate is connected to a voltage access point of the resistive voltage divider;

said resistive voltage divider, being connected between the output port of the circuit and ground, comprising the second feedback resistor, connected between the output port of the circuit and the voltage access point in-between the voltage divider having a fraction of the output voltage, and further comprising a first feedback resistor, being connected between the voltage access point in between the resistive voltage divider and ground; and the dynamic start-up circuit comprising:

a start-up comparator configured to detect if the start-up phase is finished by being configured to compare the voltage representing the output voltage of the electronic circuit with the reference voltage, wherein the start-up comparator is also configured to separate, via a first switching means, a start-up capacitor from the voltage access point of the resistive voltage divider when the start-up phase is finished;

the start-up capacitor across the first feedback resistor of the resistive voltage divider, wherein the start-up capacitor is connected to the voltage access point of the resistive voltage divider during the start-up phase only; and said first switching means connected between the voltage access point of the resistive voltage divider and the start-up capacitor.

7. The circuit of claim 6 wherein said circuit is an LDO.

8. The circuit of claim 6 wherein said circuit is an amplifier.

9. The circuit of claim 6 wherein the end of the start-up phase is reached when the voltage of the voltage access point in between the resistive voltage divider equals the reference voltage.

10. The circuit of claim 6 wherein the reference voltage is a fixed voltage.

11. The circuit of claim 6 wherein the reference voltage is a variable voltage.

12. The circuit of claim 6 wherein a second switching means is configured to provide an extra bias current to the differential amplifier of the circuit during start-up only.

13. The circuit of claim 6 wherein the start-up capacitor has a capacitance $C=C_{FF} \times R2/R1$, wherein $C_{FF}$ is the capacitance of the feed-forward capacitor, R1 is the resistance of the first feedback resistor of the resistive voltage divider and R2 is the resistance of the second feedback resistor of the voltage divider.

\* \* \* \* \*